United States Patent [19]

Ahlgren

[11] Patent Number: 5,045,897
[45] Date of Patent: Sep. 3, 1991

[54] QUATERNARY II-VI MATERIALS FOR PHOTONICS

[75] Inventor: William L. Ahlgren, Goleta, Calif.

[73] Assignee: Santa Barbara Research Center, Calif.

[21] Appl. No.: 493,493

[22] Filed: Mar. 14, 1990

[51] Int. Cl.$^5$ .................. H01L 28/161; H01L 29/205; H01L 33/00; H01L 27/14

[52] U.S. Cl. ........................................ 357/17; 357/16; 357/30; 372/43; 372/45; 372/50

[58] Field of Search ............... 357/16, 17, 30 E, 30 B; 372/43, 45

[56] References Cited

U.S. PATENT DOCUMENTS

| | | | |
|---|---|---|---|
| 3,982,261 | 9/1976 | Antypas | 357/16 |
| 4,195,305 | 3/1980 | Moon | 357/16 |
| 4,296,425 | 10/1981 | Nishizawa | 357/16 |
| 4,422,888 | 12/1983 | Stutius | 357/16 |
| 4,753,684 | 6/1988 | Ondris et al. | 357/30 E |

FOREIGN PATENT DOCUMENTS

| | | | |
|---|---|---|---|
| 57-26491 | 2/1982 | Japan | 372/17 |
| 60-178684 | 9/1985 | Japan | 372/43 |
| 61-276384 | 12/1986 | Japan | 357/17 |
| 63-140588 | 6/1988 | Japan | 372/43 |
| 63-237590 | 10/1988 | Japan | 372/43 |
| 01157576 | 6/1989 | Japan | . |

OTHER PUBLICATIONS

"New Technology for Epitaxial II-VII Compound Semiconductor Devices", Jones et al., IEEE Trans. on Electron Devices, vol. ED-34, #4, Apr. 1987, pp. 937-938.

"Growth of Cad Zn Te On Si by Low-Pressure Chemical Vapor Doposition", Jitendra et al., Appl. Phys. Lett., vol. 51, #12, Sep. 12, 1987, pp. 928-930.

"Zn Se-$Z_n$ $S_x$ $Se_{l-x}$ and Zn Se-$Zn_{1-x}$ $Mn_x$ Se Metal-Insulator-Semiconductor Hetero Junction Lasers", Jan. J. Crystal Growth, vol. 86, 1988, pp. 929-934.

"Infrared Diodes Fabricated with Hg Cd Te Grown by Molecular Beam Epitaxy on GaAs Substrates", Arias et al., Appl. Phys. Lett., vol. 54 #11, Mar. 13, 89, pp. 1025-1027.

"Incorporation and Compensation of Impurities in II-VI Semiconductors", by Y. Marfaing. Laboratoire de Physique des Solides de Bellevue CNRS, F-92195 Meudon Cedex, France, Adv. Research Workship, 9/88.

"Metalorganic Chemical Vapor Deposition Growth of $Cd_{l-y}Zn_yTe$ Epitaxial Layers on GaAs and GaAs/Si Substrate, J. Vac. Technol", A 7 (2), Mar./Apr. 1989.

"Research on Short-Wavelength Visible Laser Diodes" by T. Yao et al., (1984), (Translation not Available).

"(Zn,Hg)S and (Zn,Cd,Hg)S Electroluminescent Phosphors" by A. Wachtel, Jrnl. of the Electrochemical Society, Aug. 1960, vol. 107, No. 8.

Primary Examiner—Rolf Hille
Assistant Examiner—Mahshid Saadat
Attorney, Agent, or Firm—W. C. Schubert; W. K. Denson-Low

[57] ABSTRACT

A photonic device includes a substrate and a region comprised of a quaternary Group II-VI material supported by the substrate. Examples of quaternary Group II-IV alloys include Hg, Zn, S and Se; Hg, Zn, Se and Te; Zn, S, Se and Te; Zn, Mn, S and Se; and Hg, Cd, Zn and S. By example, the quaternary material HgZnSSe, which is lattice-matched to ZnSe or GaAs, and the quaternary material HgZnSeTe, which is lattice-matched to ZnTe or GaSb, are employed in the construction of lasers, LEDs and detectors suitable for use over a range of wavelengths. The energy bandgap of the HgZnSSe alloy may be varied to achieve emission over the entire visible spectrum while the HgZnSeTe alloy emits within the spectrum from green to far infrared.

16 Claims, 2 Drawing Sheets

FIG.1
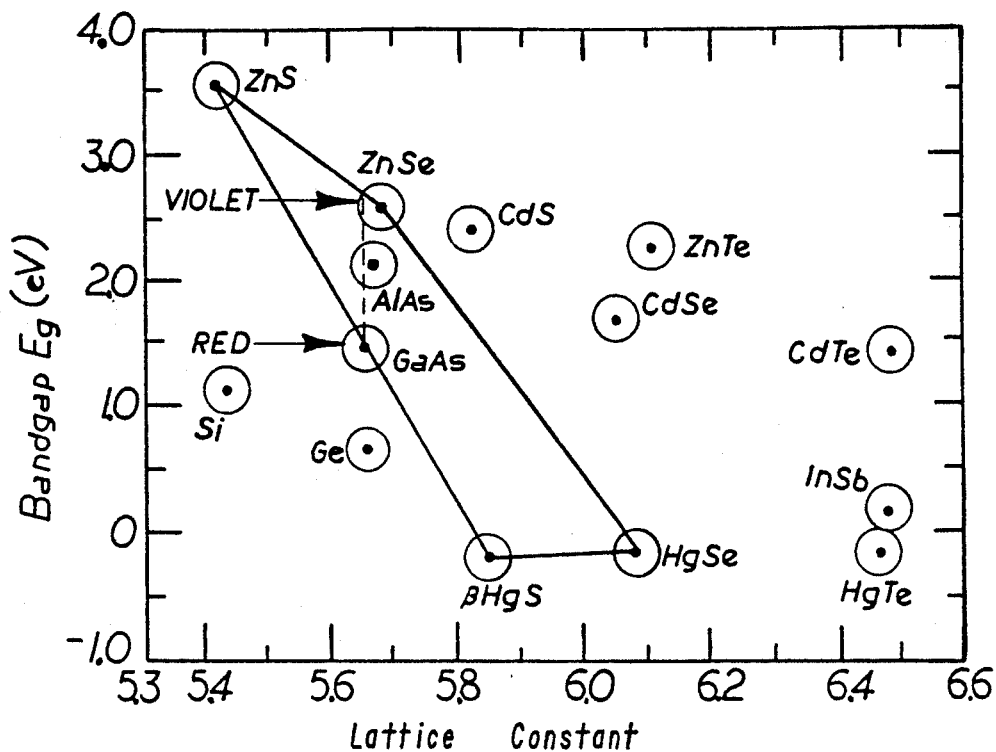
FIG.2 Bandgap Energy vs. Lattice Parameter
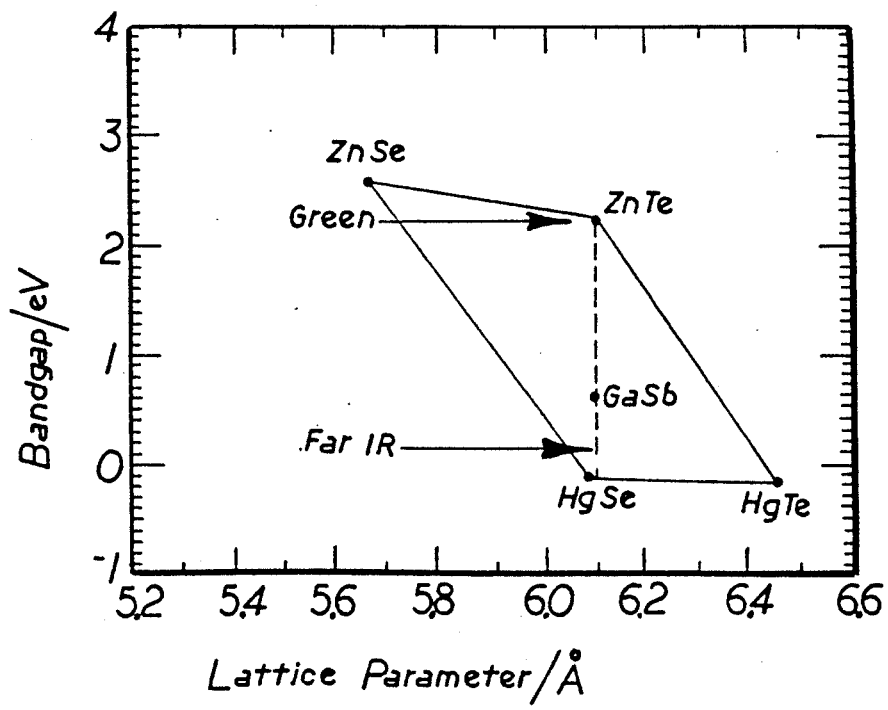

QUATERNARY II-VI MATERIALS FOR PHOTONICS

FIELD OF THE INVENTION

This invention relates generally to photonic devices and, in particular, to photonic devices that include a quaternary Group II-VI alloy.

BACKGROUND OF THE INVENTION

In U.S. Pat. No. 3,982,261, issued Sept. 21, 1976, G. Antypas discloses an epitaxial layer of a quaternary III-V alloy of Ga, In, As, and P having constituents proportioned for lattice matching to a substrate having a lattice constant falling within the range of 5.45 to 6.05. The constituents of the alloy are proportioned to provide a selected bandgap energy falling within the range of 2.23 to 0.35 electron volts; corresponding to wavelengths of 0.55 to 3.5 microns.

Currently available semiconductor diode lasers that emit in the visible spectrum are typically based on the III-V quaternary InGaAlP. However, the wavelength of these lasers is no shorter than approximately 0.67 microns (red).

Currently available light emitting diodes (LEDs) are based on the III-V ternaries GaAlAs or GaAsP. These LEDs readily emit red wavelengths with high brightness and efficiency, but can reach certain yellow and green wavelengths only with relatively low efficiency. This low efficiency at wavelengths shorter than red results because emission at these shorter wavelengths is based on trap-to-band recombination and not band-to-band recombination. As a result, conventional LEDs based on ternary III-V material cannot emit or approach blue wavelengths.

Variously colored LEDs have, however, many display applications, particularly in automobiles and airplanes where brightness is important. Short-wavelength semiconductor lasers would be extremely useful in optical data storage systems to increase information density, which is inversely proportional to the square of the optical wavelength. Also, triads of red, green, and blue lasers could be used in large-screen projection for high-definition television (HDTV) systems. A further application of short-wavelength lasers, such as a blue-green laser, is as a signal carrier for underwater communications. Other applications, both commercial and military, are also feasible.

Detectors for ultraviolet (UV) and visible radiation are also important applications as are UV and visible focal-plane arrays. For example, UV imaging is important for some surveillance and tracking applications. Visible multicolor imagers competitive with existing high-performance silicon-based Charge Coupled Devices (SiCCDs) are also applications.

It is therefore an object of the invention to provide a material for use in photonic devices and capable of emission or detection of radiation at a wavelength within the entire visible spectrum.

It is another object of the invention to provide quaternary Group II-VI alloys for use in photonic devices that exhibit direct band-to-band emission within the visible spectrum.

It is another object of the invention to provide a Group II-VI quaternary alloy of Hg, Zn, S, Se that emits within the visible spectrum from violet to red, that is, within a wavelength range of approximately 750 nanometers to approximately 390 nanometers.

It is another object of the invention to provide a Group II-VI quaternary alloy of Hg, Zn, Se, Te that emits within the spectrum from green to far-infrared, that is, within a wavelength range of approximately 0.5 microns to approximately 20 microns.

It is another object of the invention to provide a Group II-VI quaternary alloy comprised of Zn, S, Se and Te; Zn, Mn, S and Se; or Hg, Cd, Zn and S.

It is a further object of the invention to provide a Group II-VI quaternary alloy that may be compositionally varied for varying the energy bandgap, and hence determining emission wavelength, while maintaining a substantially constant lattice parameter suitable for use with a substrate comprised of Group III-V material, silicon or sapphire.

It is one further object of the invention to provide a double heterojunction injection laser having an active region comprised of a Group II-VI quaternary alloy.

SUMMARY OF THE INVENTION

The foregoing problems are overcome and the objects of the invention are realized with a photonic device including a substrate and a region comprised of a quaternary Group II-VI material supported by the substrate.

Examples of quaternary Group II-VI material are an alloy of (1) Hg, Zn, S, Se and an alloy of (2) Hg, Zn, Se, Te. The quaternary material HgZnSSe, which is lattice-matched to ZnSe or GaAs, and the quaternary material HgZnSeTe, which is lattice-matched to ZnTe or GaSb, are employed in the construction of photonic devices such as lasers, LEDs and detectors suitable for use over a range of wavelengths. The energy bandgap of the HgZnSSe alloy may be varied to achieve emission over the entire visible spectrum. The HgZnSeTe alloy emits within the spectrum from green to far-infrared.

Additional examples of quaternary Group II-VI material include the following.

(3) An alloy of Zn, S, Se, and Te which has an energy bandgap in the spectral range of yellow to blue at a fixed lattice parameter equal to that of GaAs.

(4) An alloy of Zn, Mn, S, and Se which has an energy bandgap in the spectral range of blue to ultraviolet at a fixed lattice parameter substantially equal to that of GaAs.

(5) An alloy of Hg, Cd, Zn, and S which is believed to have an energy bandgap that spans the visible spectral range.

The invention thus encompasses photonic devices that include a region comprised of a quaternary Group II-VI alloy.

The invention further encompasses photonic devices that include a substrate having a characteristic lattice constant and at least one epitaxial layer consisting essentially of a quaternary Group II-VI alloy having a composition selected for substantially lattice matching the epitaxial layer to the substrate.

In accordance with an embodiment of the invention there is disclosed a double heterojunction injection laser. The laser includes (1) a substrate; (2) a first cladding layer overlying the substrate and comprising a binary or a ternary Group II-VI material having a first type of electrical conductivity; (3) an active region comprised of a quaternary Group II-VI alloy overlying the first cladding layer; and (4) a second cladding layer overlying the active region and comprising a binary or a ternary Group II-VI material having a second type of electrical conductivity.

BRIEF DESCRIPTION OF THE DRAWING

The above set forth and other features of the invention will be made more apparent in the ensuing Detailed Description of the Invention when read in conjunction with the attached Drawing, wherein:

FIG. 1 is a bandgap energy ($E_g$) diagram that plots $E_g$ against lattice parameter for certain binary II-VI compounds (Hg, Zn)(S, Se) and for GaAs, wherein tie lines indicate linear interpolation for ternary or quaternary alloys of intermediate composition;

FIG. 2 is a bandgap energy diagram that plots $E_g$ against lattice parameter for certain binary II-VI compounds (Hg, Zn)(Se, Te) and for GaSb, wherein tie lines indicate linear interpolation for ternary or quaternary alloys of intermediate composition;

DETAILED DESCRIPTION OF THE INVENTION

Figure 3:
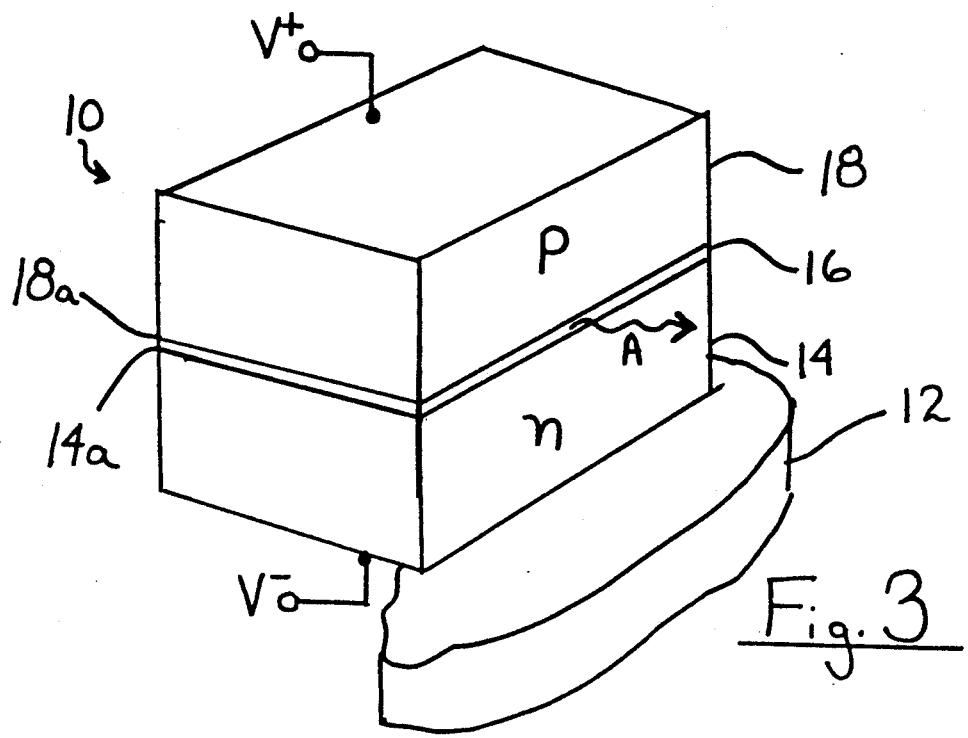
FIG. 3 is a schematic perspective view, not to scale, of a double heterojunction injection laser incorporating quaternary Group II-VI material.

There are now described quaternary alloys comprised of elements selected from Group II-VI of the Periodic Table of the Elements, referred to herein as Group II-VI material or as II-VI material. These quaternary alloys are shown to be suitable for the fabrication of photonic devices, such as diode lasers and LEDs, having wavelengths spanning the entire visible spectrum from violet to red, as well as infrared wavelengths. These photonic devices function by direct band-to-band recombination rather than by trap-to-band recombination and thus achieve greater efficiencies and brightness than conventional devices. As used herein a photonic device includes those devices that emit, detect, or modify electromagnetic energy. Examples of such devices include lasers, LEDs, photodetectors including arrays of photovoltaic or photoconductive devices, and non-linear optical devices.

FIG. 1 is a bandgap energy diagram that plots $E_g$ against lattice parameter for binary Group II-VI compounds comprised of (Hg, Zn)(S, Se) and for GaAs. FIG. 2 is a bandgap energy diagram plotting $E_g$ against lattice parameter for binary Group II-VI compounds comprised of (Hg, Zn)(Se, Te) and for GaSb. In both FIG. 1 and FIG. 2 the tie lines indicate a linear interpolation of lattice parameter for ternary or quaternary alloys of intermediate composition.

As can be seen in the diagrams of FIG. 1 and FIG. 2 the quaternary semiconductor alloys provide for the energy bandgap to be varied while maintaining a constant lattice parameter. $Hg_{(1-x)}Zn_xS_{(1-y)}Se_y$ is one direct-bandgap quaternary material suitable for photonic applications, $Hg_{(1-x)}Zn_xS_{(1-y)}Se_y$ having constituents that may be varied for maintaining a constant lattice parameter equal to that of ZnSe or GaAs. A second quaternary alloy of interest is $Hg_{(1-x)}Zn_xSe_{(1-y)}Te_y$ which spans in energy bandgap the spectrum from green to far infrared, $Hg_{(1-x)}Zn_xS_{(1-y)}Se_y$ having constituents that may be varied for maintaining a constant lattice parameter equal to that of ZnTe or GaSb. For this latter quaternary alloy GaAs substrates are also suitable for use in that an intermediate ZnTe buffer layer of good quality can be grown on GaAs substrates, as described by W. L. Ahlgren, S. M. Johnson, E. J. Smith, R. P. Ruth, B. C. Johnson, M. H. Kalisher, C. A. Cockrum, T. W. James, and D. L. Arney, in J. Vac. Sci. Technol. A7, 331 (1989).

Additional examples of quaternary Group II-VI material include the following.

An alloy of Zn, S, Se, and Te having an energy bandgap in the spectral range of yellow to blue at a fixed lattice parameter equal to that of GaAs. This alloy has one cation and three anions and has a compositional formula of $ZnS_{(1-x-y)}Se_xTe_y$. A bandgap energy diagram for this alloy is based on the three binary compounds ZnS, ZnSe and ZnTe.

An alloy of Zn, Mn, S, and Se having an energy bandgap in the spectral range of blue to ultraviolet at a fixed lattice parameter substantially equal to that of GaAs. However, this alloy is believed to experience changes in lattice structural type with increasing Mn content, which may limit the useful range of energy gaps. This alloy has a compositional formula of $Zn_{(1-x)}Mn_xS_{(1-y)}Se_y$. A bandgap energy diagram for this alloy is based upon the four binary compounds ZnS, MnS, ZnSe and MnSe.

An alloy of Hg, Cd, Zn, and S believed to span the visible spectral range in energy gap, but is also believed to experience changes in lattice structural type for different compositions. This alloy has one anion and three cations and has a compositional formula of $Hg_{(1-x-y)}Cd_xZn_yS$. A bandgap energy diagram for this alloy is based on the three binary compounds HgS, CdS and ZnS.

In the foregoing examples x and y each have a value greater than zero and less than one for determining the constituents of the alloy. The values of x and y are selected for substantially lattice matching the quaternary alloy to the substrate, the values of x and y also determining the emission or absorption wavelength of the alloy. In this regard, and relating specifically to photovoltaic detectors of radiation, the device may be constructed with a p-n junction, a Schottky barrier or an isotype heterojunction. By example, HgS or HgSe forms one side of the junction and $Hg_{(1-x)}Zn_xS_{(1-y)}Se_y$ the other, creating an n-n isotype heterojunction responsive to radiation having a wavelength determined by the values of x and y.

As employed herein a material is considered to be lattice matched to another material, such as a substrate, when the degree of lattice matching is sufficient to reduce an interface dislocation surface density to a value that has a substantially insignificant impact on device performance. A typical value for matching of lattice constants is 0.5%, although the actual value is device and application dependent.

Suitable substrate materials include but are not limited to ZnSe, ZnSSe, ZnTe, GaAs, GaSb, InP, Si, sapphire ($Al_2O_3$) and combinations of these materials, such as ZnSe or GaAs grown upon Si (ZnSe/Si, GaAs/Si) and the aforementioned ZnTe grown upon GaAs (ZnTe/GaAs).

A presently preferred method of fabricating the Group II-VI quaternary alloy is by metalorganic chemical vapor deposition (MOCVD), particularly photo-assisted MOCVD, although molecular beam epitaxy (MBE), metalorganic molecular beam epitaxy (MOMBE) and vapor phase epitaxy (VPE) are also suitable. Photo-assisted MOCVD is a presently preferred fabrication process in that it can be accomplished at relatively low temperatures to reduce native point-defect creation in the semiconductor.

An important consideration in the fabrication of photonic devices employing wide-energy bandgap material, including quaternary Group II-VI material, is the doping of the material. A recognized difficulty in achieving bipolar doping of binary materials, such as high conductivity p-type ZnSe and/or high conductivity n-type ZnTe, has previously limited application of these and other wide-bandgap Group II-VI materials.

A solution to this problem is proposed by Y. Marfaing in Proceedings of NATO Advanced Research Workshop on the Future of Small-Gap Semiconductors, Liege, Belgium, Sept. 5-9, 1988. Marfaing concludes that the generation of non-equilibrium carriers in a semiconductor which is in contact with an external gas phase can bring about a change in the concentration of lattice defects created by exchange between the two phases. If the total concentration of vacancies can be reduced, as described in the article, any compensation process involving vacancies will become less active and will ultimately be suppressed. As a result, a strong electrical activity of doping impurities may be achieved. In this regard, non-equilibrium incorporation processes, including doping under light excitation, is described by Marfaing.

In commonly assigned U.S. patent application Ser. No. 07/434,642, filed Nov. 9, 1989 and entitled "Reactor For Laser-Assisted Chemical Vapor Deposition", W. L. Ahlgren describes apparatus and method for accomplishing epitaxial layer growth with laser-assisted CVD. The system provides low temperature growth and doping of Group II-VI material from organometallic reactants. To achieve light excitation of the growing layer in a manner suggested by Marfaing a second light beam from an argon ion laser or a HgXe arc lamp is directed perpendicular to a substrate whereon epitaxial layer growth is occurring. Dopants are introduced into the reactor and incorporated into the growing semiconductor layer. By example, for creating p-type ZnSe a preferred dopant is nitrogen. Sodium and lithium may also be suitable although lithium is believed to be interstitial and also to have an unacceptably high diffusion rate. N-type doping of ZnSe may be accomplished with gallium.

Another approach to forming p-type ZnSe is described by T. Yasuda, I. Mitsuishi, and H. Kukimoto in an article entitled "Metal-Organic VPE of Low Resistivity p-type ZnSe", Appl. Phys. Lett., Vol. 52, pp. 57-59, (1988). In this approach, $Li_3N$ is used as the dopant and it is presumed that Li on Zn sites ($Li_{Zn}$) and nitrogen on Se sites ($N_{Se}$) are both active acceptor species.

Delta-doped structures based on HgZnSSe and HgZnSeTe are also encompassed by the invention. By example, delta-doping is described in an article by F. Quiang, D. Lee, A. V. Nurmikko, L. A. Kolodziejski, and R. L. Gunshor, Phys. Rev. B 39, 3173 (1989).

In general, factors affecting the suitability of dopants include solubility, the mode of incorporation, energy level, and diffusivity. The solubility in a host lattice must exceed the required doping level, for example $10^{18}$ cm$^{-3}$ to $10^{19}$ cm$^{-3}$. The mode of incorporation refers to two features: (a) the defect species corresponding to the dissolved dopant (i.e., interstitial, substitutional on cation site, or substitutional on anion site) and (b), for charged defects, the main compensating, or oppositely charged, defect species. Both of these features are typically dependent on the conditions of preparation, such as temperature and Group II element vapor pressure. A desirable mode of incorporation is for the dopant to result in a unique, preferably substitutional, defect species and to be charge-compensated by a free carrier. The free carrier is an electron in the conduction band for donors or a hole in the valence band for acceptors. The energy level of the dopant is preferably shallow, that is, within a few kT of the appropriate band edge, where k is Boltzmann's constant and T is temperature. If the energy level is too deep, the dopant species will not be ionized at room temperature and thus will not increase the conductivity of the crystal. Finally, the diffusivity of the dopant species should be low, not only at room temperature but also at the growth temperature, so that doping profiles can be established and maintained. Interstitial species, such as lithium referred to above, are generally unsuitable as dopants because they have high diffusion rates.

FIG. 3 is a schematic perspective view, not to scale, of a double heterojunction injection laser 10 comprising a substrate 12, a lower cladding layer 14, an active layer 16 comprised of, in accordance with an embodiment of the invention, quaternary Group II-VI material, and an upper cladding layer 18. Electrical terminals coupled to the lower and the upper cladding layers 14 and 18 couple the laser 10 to a source of electrical excitation designated as V+ and V−.

In greater detail the substrate 12 is depicted in a partially cut-away manner and is comprised of, by example, GaAs, although other substrate materials such as those referred to above could be employed. The lower cladding layer 14 has a thickness of approximately one to two microns and is comprised of $ZnS_{(1-y)}Se_y$, the constituents being determined during growth such that the lower cladding layer 14 is lattice matched to the substrate 12. Lower cladding layer 14 is doped during laser-assisted MOCVD deposition with, for example, gallium and is also photo-excited during deposition to reduce the total concentration of vacancies and to thus suppress any compensation process involving vacancies. The n-type doping level of lower cladding layer 14 is approximately $10^{18}$ cm$^{-3}$ to approximately $10^{19}$ cm$^{-3}$.

The active layer 16 is substantially homogeneous and is comprised of the Group II-VI quaternary $Hg_{(1-x)}Zn_xS_{(1-y)}Se_y$ having a thickness of approximately 0.2 microns. The values of x and y are established during epitaxial growth to adjust the value of $E_g$ to obtain a desired output wavelength within the red to violet spectrum and also to lattice match the active layer 16 to the substrate 12. The active layer 16 may be provided as substantially undoped material or may be relatively lightly doped, relative to the cladding layer 14, at a concentration of approximately $10^{15}$ cm$^{-3}$.

The upper cladding layer 18 has a thickness of approximately one to two microns and is also comprised of $ZnS_{(1-y)}Se_y$, the constituents being such that the upper cladding layer 18 is also lattice matched to the substrate 12. Upper cladding layer 18 is doped during laser-assisted MOCVD deposition with, for example, nitrogen and is also photo-excited during deposition to reduce the total concentration of vacancies as previously described. The p-type doping level of the upper cladding layer 18 is, for example, also approximately $10^{18}$ cm$^{-3}$ to approximately $10^{19}$ cm$^{-3}$.

As can be seen the laser 10 includes a first heterojunction 14a and a second heterojunction 18a and functions through direct band-to-band recombination as a double heterojunction injection laser having a predetermined output beam (A) wavelength within the red to violet spectrum. Other processing steps such as cleaving and mirroring appropriate surfaces of the laser 10 are accomplished in a conventional manner.

Figure 4:
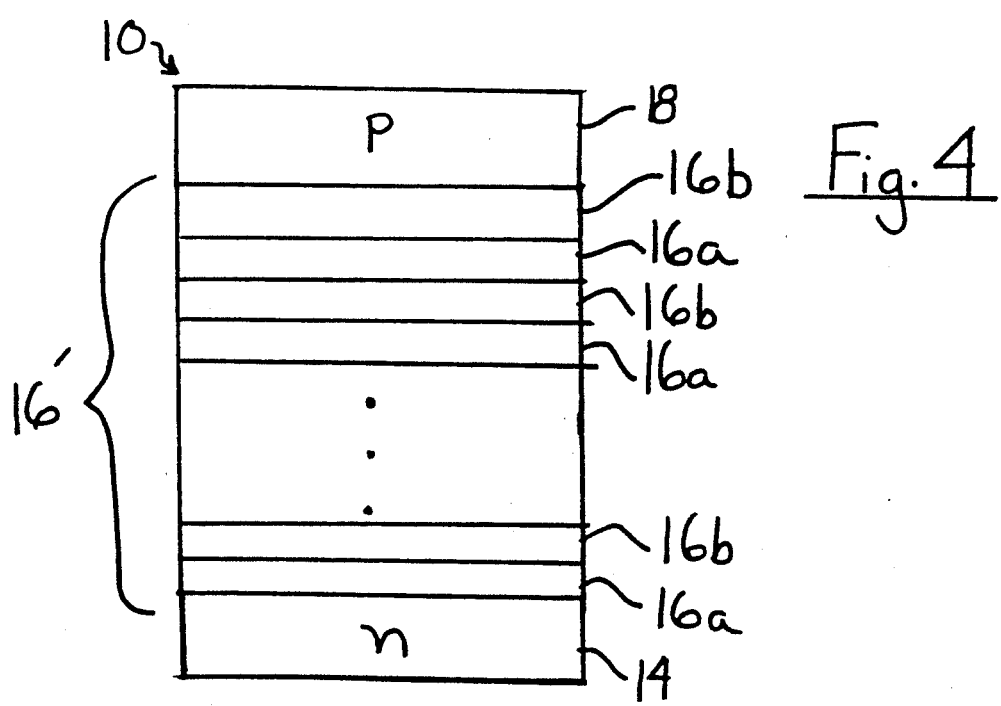
FIG. 4 is a side view, not to scale, of another embodiment of a double heterojunction injection laser that includes a multi-quantum well active layer containing quaternary Group II-VI material.

FIG. 4 is a side view, not to scale, of another embodiment of a double heterojunction injection laser of FIG. 3. The laser includes a multi-quantum well active layer 16' incorporating quaternary Group II-VI material, the active layer 16' being interposed between cladding layers 14 and 18 as described above. The substrate 12 is not shown in FIG. 4. The active layer 16' includes a plurality of pairs of semiconductor layers 16a and 16b. The layer 16a is comprised of the Group II-VI quaternary $Hg_{(1-x)}Zn_xS_{(1-y)}Se_y$ and has a thickness on the order of 100 Angstroms. The values of x and y are established during growth to adjust the value of $E_g$ to obtain the desired output wavelength within the red to violet spectrum and also to lattice match the layers 16a to the substrate 12. Layer 16b is comprised of ZnSe or ZnSSe and also has a thickness on the order of 100 Angstroms.

In addition, ZnSe-HgS and ZnTe-HgSe superlattices are alternatives to homogeneous quaternary alloys as materials for photonic applications. That is, the laser of FIG. 4 is provided with cladding layers as previously described but the active region 16' is comprised of alternating layers of the binary compounds ZnSe-HgS or ZnTe-HgSe. For example, layer 16a is comprised of ZnSe and layer 16b is comprised of HgS. In this case the thickness of the layers 16a and 16b are adjusted during growth to achieve a desired lattice constant for lattice matching to the substrate and also to achieve a desired emission wavelength.

Furthermore, multilayer Group II-VI structures including strained-layer superlattices that employ modulation doping are encompassed by the invention. Modulation doping is described in an article by J. W. Han, S. Hwang, Y. Lansari, R. L. Harper, Z. Yang, N. C. Giles, J. W. Cook, Jr., J. F. Schetzina, and S. Sen, Appl. Phys. Lett. 54, 63 (1988).

High temperature operation of Group II-VI quaternary alloys is compatible with large energy bandgaps available in Group II-VI material. High-speed devices such as heterojunction FETs also benefit from the low electron effective mass, and hence high mobility, in the narrow-bandgap Group II-VI materials coupled with the large gate-voltage swing made available by use of a wide-bandgap Group II-VI material. In that wide-bandgap II-VI material can be grown epitaxially on GaAs, there is also a potential for fabrication of hybrid II-VI/III-V high-speed device structures.

Quaternary alloys of Group II-VI material may also serve as a basis for an integrated optoelectronic circuit technology. In addition to the light emitters and detectors mentioned above, such a technology requires optical switches and interconnects such as waveguides. These components make use of nonlinear optical effects and refractive index control.

Thus, while the invention has been particularly shown and described with respect to preferred embodiments thereof, it will be understood by those skilled in the art that changes in form and details may be made therein without departing from the scope and spirit of the invention.

What is claimed is:

1. A photonic device including a region comprised of a quaternary Group II-VI alloy containing Hg as one atomic constituent and a substrate supporting the region, the substrate having a characteristic lattice constant, and wherein the quaternary Group II-VI alloy has a composition selected for substantially lattice matching the region to the substrate and also for providing the region with an energy bandgap associated with a wavelength of interest.

2. A photonic device as set forth in claim 1 wherein the quaternary Group II-VI alloy is comprised of $Hg_{(1-x)}Zn_xS_{(1-y)}Se_y$ where x and y each have a value greater than zero and less than one.

3. A photonic device as set forth in claim 1 wherein the quaternary Group II-VI alloy is comprised of $Hg_{(1-x)}Zn_xSe_{(1-y)}Te_y$ where x and y each have a value greater than zero and less than one.

4. A photonic device as set forth in claim 1 wherein the quaternary Group II-VI alloy is comprised of $Hg_{(1-x)}A_xB_{(1-y)}C_y$ where A is Zn or Cd, B is S, Se or Te and C is S, Se or Te and x and y each have a value greater than zero and less than one.

5. A photonic device as set forth in claim 1 wherein the quaternary Group II-VI alloy is comprised of $Hg_{(1-x-y)}Cd_xZn_yC$ where C is S, Se or Te and x and y each have a value greater than zero and less than one.

6. A photonic device as set forth in claim 1 wherein the quaternary Group II-VI alloy is comprised of $Hg_{(1-x-y)}Cd_xZn_yS$ where x and y each have a value greater than zero and less than one.

7. A photonic device as set forth in claim 1 wherein the substrate is comprised of material selected from the group consisting of GaAs and ZnSe.

8. A photonic device as set forth in claim 1 wherein the substrate is comprised of material selected from the group consisting of ZnTe, GaAs, and GaSb and combinations thereof.

9. A photonic device as set forth in claim 1 wherein the region is comprised of a substantially homogeneous epitaxial layer.

10. A photonic device as set forth in claim 1 wherein the region is comprised of a plurality of epitaxial layers arranged as a multilayered structure.

11. A photonic device as set forth in claim 10 wherein the multilayered structure is comprised of a first plurality of layers selected from the group comprising (i) $Hg_{(1-x)}A \times B_{(1-y)}C_y$ where A is Zn or Cd, B is S, Se or Te and C is S, Se or Te and x and y each have a value greater than zero and less than one and (ii) $Hg_{(1-x-y)}Cd_xZn_yC$ where C is S, Se or Te and x and y each have a value greater than zero and less than one, individual ones of which alternate with individual ones of a second plurality of layers selected from the group comprising (i) $Hg_{(1-x')}A_{x'}B_{(1-y')}C_{y'}$ where A is Zn or Cd, B is S, Se or Te and C is S, Se or Te and x' and y' each have a value greater than zero and less than one and (ii) $Hg_{(1-x'-y')}Cd_{x'}Zn_{y'}C$ where C is S, Se or Te and x' and y' each have a value greater than zero and less than one, with x, y and x', y' selected so that the lattice parameters of the individual layers are all equal, but the energy gaps are different.

12. A photonic device as set forth in claim 1 wherein the wavelength of interest lies within the visible spectrum.

13. A double heterojunction injection laser comprising:
    a substrate;

a first cladding layer overlying the substrate, the first cladding layer being comprised of a binary or a ternary Group II-VI material having a first type of electrical conductivity;

an active region overlying the first cladding layer, the active region being comprised of a quaternary Group II-VI alloy containing Hg as one atomic constituent; and a second cladding layer overlying the active region, the second cladding layer being comprised of a binary or a ternary Group II-VI material having a second type of electrical conductivity.

14. A double heterojunction injection laser as set forth in claim 13 wherein the substrate has a characteristic lattice constant and wherein the quaternary Group II-VI alloy is comprised of $Hg_{(1-x)}Zn_xS_{(1-y)}Se_y$ where x and y each have a value greater than zero and less than one for substantially lattice matching the active region to the substrate and also for determining the energy bandgap of the quaternary Group II-VI alloy such that the alloy emits electromagnetic radiation having a characteristic wavelength within the range of wavelengths associated with red light to violet light.

15. A double heterojunction injection laser as set forth in claim 13 wherein the active region is comprised of a substantially homogeneous epitaxial layer.

16. A double heterojunction injection laser set forth in claim 13 wherein the active region is comprised of a first plurality of layers selected from the group comprising (i) $Hg_{(1-x)}A_xB_{(1-y)}C_y$ where A is Zn or Cd, B is S, Se or Te and C is S, Se or Te and x and y each have a value greater than zero and less than one and (ii) $Hg_{(1-x-y)}Cd_xZn_yC$ where C is S, Se or Te and x and y each have a value greater than zero and less than one, individual ones of which alternate with individual ones of a second plurality of layers selected from the group comprising (i) $Hg_{(1-x')}A_{x'}B_{(1-y')}C_{y'}$ where A is Zn or Cd, B is S, Se or Te and C is S, Se or Te and x' and y' each have a value greater than zero and less than one and (ii) $Hg_{(1-x'-y')}Cd_{x'}Zn_{y'}C$ where C is S, Se or Te and x' and y' each have a value greater than zero and less than one, with x, y and x', y' selected so that the lattice parameters of the individual layers are all equal, but the energy gaps are different.

* * * * *